United States Patent [19]

Irving et al.

[11] Patent Number: 4,957,988
[45] Date of Patent: Sep. 18, 1990

[54] PROCESS AND POLYMERS FOR THE PRODUCTION OF IMAGES

[75] Inventors: Edward Irving, Cambridge, England; Beat Müller, Marly, Switzerland; Adrian Schulthess, Villars-sur-Glane, Switzerland; Max Hunziker, Bösingen, Switzerland

[73] Assignee: Ciba-Geigy Corporation, Ardsley, N.Y.

[21] Appl. No.: 178,810

[22] Filed: Mar. 28, 1988

Related U.S. Application Data

[63] Continuation of Ser. No. 865,495, May 20, 1986, abandoned.

[30] Foreign Application Priority Data

May 22, 1985 [GB] United Kingdom ................ 8512998

[51] Int. Cl.$^5$ .................... C08F 226/06; C08F 228/02
[52] U.S. Cl. ..................................... 526/259; 430/325; 526/280; 526/287
[58] Field of Search ............... 526/259, 262, 287, 280, 526/284

[56] References Cited

U.S. PATENT DOCUMENTS 3,732,273  5/1973  Heine et al.
3,936,429  2/1976  Seoka ................... 526/287
4,258,121  3/1981  Kojima .
4,310,699  1/1982  Rabilloud et al.
4,411,823 10/1983  Hageman et al.
4,438,245  3/1984  Satomura ............. 526/286
4,504,372  3/1985  Kirchmayr et al.
4,510,290  4/1985  Kirchmayr et al.
4,546,159 10/1985  Taylor ................... 526/286
4,548,870 10/1985  Ogawa ................. 428/474.7
4,680,356  7/1987  Washburn ........... 526/256

FOREIGN PATENT DOCUMENTS 2120263 11/1983 United Kingdom.

OTHER PUBLICATIONS

E. B. Womack et al., J. Chem. Soc., 1938, 1402.
D. J. Cooper et al., J. Chem. Soc. 1966, Sec C., 533.
Derwent CPI Abstract No. 72755E/35.

Primary Examiner—Christopher Henderson
Attorney, Agent, or Firm—Stephen V. O'Brien

[57] ABSTRACT

A polymer having a molecular weight of at least 500 and containing at least one residue of formula I

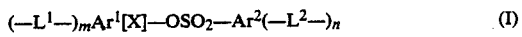

$$(-L^1-)_m Ar^1[X]-OSO_2-Ar^2(-L^2-)_n \qquad (I)$$

where
one of m and n denotes 1 and the other denotes 0 or 1,
X denotes either a group of formula II

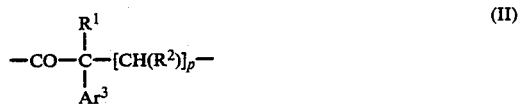

$$-CO-\underset{Ar^3}{\overset{R^1}{\underset{|}{C}}}-[CH(R^2)]_p- \qquad (II)$$

linked through the carbonyl group to an aromatic carbon atom in Ar$^1$, or
a group of formula III

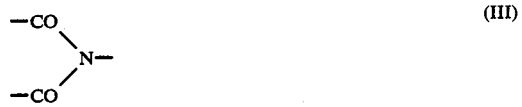

$$\begin{matrix} -CO \\ \phantom{-CO} \diagdown \\ \phantom{-COOO} N- \\ \phantom{-CO} \diagup \\ -CO \end{matrix} \qquad (III)$$

linked through the carbonyl groups to aromatic carbon atoms in Ar$^1$,
p denotes zero or 1,
when p denotes zero, R$^1$ denotes a hydrogen atom or a monovalent aliphatic, araliphatic or aromatic group,
when p denotes 1, R$^1$ denotes a hydrogen atom, a hydroxyl group, an etherified hydroxyl group, an acyloxy group, an alkyl group or a phenyl-substituted alkyl group,
r$^2$ denotes a hydrogen atom or a monovalent aliphatic, cycloaliphatic, heterocyclic, aromatic or araliphatic group,
Ar$^1$ denotes a monovalent, divalent or trivalent aromatic group,
Ar$^2$ denotes a monovalent or divalent aromatic group, and
Ar$^3$ denotes a monovalent aromatic group, and
L$^1$ and L$^2$ each denote —CO—, —COO—, —CONH—, —OCOO—, —NHCONH—, —OCONH—, —CSS—, OCSS—, —OSO$_2$—, —CH$_2$—, —CH=, —O—, —S— or —N=.

These polymers, which can be prepared in known manner from intermediates, some of which intermediates are novel, are suitable for the production of images which are obtained by exposure to actinic radiation and subsequent development with aqueous bases.

15 Claims, No Drawings

PROCESS AND POLYMERS FOR THE PRODUCTION OF IMAGES

This application is a continuation of Ser. No. 865,495, filed on May 20, 1986, now abandoned.

This invention relates to a process for the production of images, to polymers useful therein, and to intermediates and monomers useful in preparing the polymers.

In the production of an image using a positive photoresist, portions of the resist which are exposed to actinic radiation are rendered more soluble in, or at least more easily removable by, a developer than the unexposed portions. Removal when required of the exposed portions by means of the developer, leaving the unexposed portions intact, results in formation of a positive image.

Commercially available positive photoresist compositions generally contain, in addition to a film-forming organic material, an o-naphthoquinone diazide which decomposes on exposure to actinic radiation, evolving nitrogen and forming an indenecarboxylic acid. The film-forming organic material is usually an alkali-soluble phenol-formaldehyde novolak resin. Its dissolution into aqueous alkaline solution is inhibited by the naphthoquinone diazide; when, however, this diazide is decomposed in the actinically-irradiated areas, its efficacy as dissolution rate inhibitor decreases and the exposed areas of the coating become more soluble in a basic developer than are the unexposed areas. However, the quinonediazides are not entirely satisfactory, due to their thermal instability; even protected from actinic radiation they decompose at moderately elevated temperatures, and the quality of the image produced is then inferior. Further, relatively large proportions of these diazides are required for them to be useful as solubility inhibitors. As they absorb strongly in the preferred deep ultraviolet range, compositions containing them are relatively opaque to radiation in that range and cannot be developed in depth, e.g., to the interface of the substrate, because the radiation cannot penetrate deeply into the coating.

Monomeric substances are known which have a photosensitive residue containing a sulphonyloxy group attached through the oxy oxygen atom thereof to an aliphatic carbon atom which is itself in a position alpha or beta to a carbonyl group and alpha or beta to an aromatic group. Such substances are described, for example, in U.S. Pat. Nos. 4,411,823 and 4,510,290.

Also known are monomeric substances having a photosensitive residue containing a N-sulphonyloxyimide group linked through the carbonyl groups thereof or the sulphur atom thereof directly to an aromatic group. Such substances are described, for example, in U.S. Pat. No. 4,258,121.

These known photosensitive substances have been described in the abovementioned references as curing agents for resins such as aminoplasts and phenol-aldehyde resols, and as sources of free radicals in the photopolymerisation of ethylenically unsaturated materials.

We have now found that by exposing to actinic radiation an organic polymer containing a photosensitive residue having either (a) a sulphonyloxy group attached through the oxy atom thereof to an aliphatic carbon atom which is itself in a position alpha or beta to a carbonyl group and alpha or beta to an aromatic group or (b) a sulphonyloxyimide group linked through the carbonyl groups thereof or the sulphur atom thereof directly to an aromatic group, the solubility of the polymer in an aqueous base developer is increased in exposed areas.

Accordingly, the present invention provides a process for the production of an image which comprises (i) exposing to actinic radiation in a predetermined pattern a layer of an organic polymer having a photosensitive residue containing either (a) a sulphonyloxy group attached through the oxy oxygen atom thereof to an aliphatic carbon atom which is in a position alpha or beta to a carbonyl group and alpha or beta to an aromatic group or (b) a N-sulphonyloxyimide group linked through the carbonyl groups thereof or the sulphur atom thereof directly to an aromatic group, thereby rendering the polymer more soluble in an aqueous base developer in exposed areas than in unexposed areas, and (ii) removing the polymer in the exposed areas by treatment with an aqueous base developer.

Polymers suitable for use in the process of the invention are generally solid, i.e. film forming, polymers.

Accordingly, this invention also provides a photosensitive organic polymer having a molecular weight of at least 500 and containing at least one residue of formula I

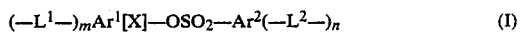

where
one of m and n denotes 1 and the other denotes 0 or 1,
X denotes either a group of formula II

linked through the carbonyl group to an aromatic carbon atom in $Ar^1$, or
a group of formula III

linked through the carbonyl groups to aromatic carbon atoms in $Ar^1$,
p denotes zero or 1,
when p denotes zero, $R^1$ denotes a hydrogen atom or a monovalent aliphatic, araliphatic or aromatic group,
when p denotes 1, $R^1$ denotes a hydrogen atom, a hydroxyl group, an etherified hydroxyl group, an acyloxy group, an alkyl group or a phenyl-substituted alkyl group,
$R^2$ denotes a hydrogen atom or a monovalent aliphatic, cycloaliphatic, heterocyclic, aromatic or araliphatic group,
$Ar^1$ denotes a monovalent, divalent or trivalent aromatic group,
$Ar^2$ denotes a monovalent or divalent aromatic group, and
$Ar^3$ denotes a monovalent aromatic group,
$L^1$ and $L^2$ each denote —CO—, —COO—, —CONH—, —OCOO—, —NHCONH—, —OCONH—, —CSS—, OCSS—, —OSO$_2$—, —CH$_2$—, —CH=, —O—, —S— or —N=. If each of m and n denotes 1, preferred combinations of $L^1$ and $L^2$ can be ascertained from the examples to formulae XVI and XVII.

When the photosensitive polymer contains a residue of formula I in which X denotes a group of formula II, preferred polymers are those in which
p denotes zero,
$R^1$ denotes a hydrogen atom; a $C_1$-$C_8$ alkyl group which is unsubstituted or substituted by —OH, —Cl, —CN, $C_1$-$C_4$ alkoxy, $C_2$-$C_5$ alkoxycarbonyl, phenyl, chlorophenyl, $C_7$-$C_{10}$ alkylphenyl or $C_7$-$C_{10}$ alkoxyphenyl; a phenyl group which is unsubstituted or substituted by —Cl, $C_1$-$C_4$ alkyl, $C_1$-$C_4$ alkoxy or $C_1$-$C_4$ alkylthio; a benzoyl group; an alkoxycarbonyl group of 2 to 8 carbon atoms; $C_1$-$C_4$—alkyl—NH—CO—; phenyl—NHCO—; —$CONH_2$; or a cyano group;
$Ar^1$ and $Ar^2$ each denote a monovalent or divalent aromatic group of 6 to 30 carbon atoms, at least one of $Ar^1$ and $Ar^2$ being divalent, and
$Ar^3$ denotes a phenyl group which is unsubstituted or substituted by —Cl, $C_1$-$C_4$ alkyl, $C_1$-$C_4$ alkoxy or $C_1$-$C_4$ alkylthio.

Especially preferred polymers of the class where X denotes a group of formula II and p denotes zero are those where
$R^1$ denotes a hydrogen atom or $C_1$-$C_4$ alkyl,
$Ar^1$ and $Ar^2$ each represent a phenyl or phenylene group, at least one of $Ar^1$ and $Ar^2$ being a phenylene group, and
$Ar^3$ denotes a phenyl group.

Other preferred photosensitive polymers containing a residue of formula I where X denotes a group of formula II are those in which
p denotes 1,
$R^1$ denotes a hydrogen atom, a hydroxyl group, $C_1$-$C_4$ alkoxy, acetyloxy or a $C_1$-$C_8$ alkyl group which is unsubstituted or substituted by phenyl,
$R^2$ denotes a hydrogen atom; $C_1$-$C_8$ alkyl which is unsubstituted or substituted by —OH, —Cl or phenyl; phenyl which is unsubstituted or substituted by —OH, —Cl, $C_1$-$C_4$ alkyl or $C_1$-$C_4$ alkoxy; $C_2$-$C_6$ alkenyl; $C_8$-$C_9$ phenylalkenyl; furyl; $C_5$-$C_6$ cycloalkyl; or $C_5$-$C_6$ cycloalkenyl;
$Ar^1$ and $Ar^2$ each represent a monovalent or divalent aromatic group of 6 to 30 carbon atoms, at least one of $Ar^1$ and $Ar^2$ being divalent, and
$Ar^3$ denotes a phenyl group which is unsubstituted or substituted by —Cl, $C_1$-$C_4$ alkyl, $C_1$-$C_4$ alkoxy or $C_1$-$C_4$ alkylthio.

More particularly preferred polymers of this class are those in which
$R^1$ denotes a hydroxyl group, a $C_1$-$C_4$ alkyl group or a $C_1$-$C_4$ alkoxy group,
$R^2$ denotes a hydrogen atom or a $C_1$-$C_4$ alkyl group, and
$Ar^1$ and $Ar^2$ each represent a phenyl, naphthyl, phenylene or naphthylene group which is unsubstituted or substituted by —Cl, —Br, —CN, —$NO_2$, $C_1$-$C_{12}$ alkyl, $C_1$-$C_4$ alkoxy or $C_1$-$C_8$ alkylthio, at least one of $Ar^1$ and $Ar^2$ being a said unsubstituted or substituted phenylene or naphthylene group.

Especially preferred polymers of the class where X denotes a group of formula II and p denotes 1 are those in which
$R^1$ denotes a hydroxyl group or $C_1$-$C_4$-alkoxy,
$R^2$ denotes a hydrogen atom, $Ar^1$ and $Ar^2$ each denote a phenyl or phenylene group, at least one of $Ar^1$ and $Ar^2$ denoting a phenylene group, and
$Ar^3$ denotes a phenyl group.

In the especially preferred polymers containing a residue of formula I where X is a group of formula II, preferably one of m and n denotes zero and the other denotes 1. Specific preferred polymers of this kind are those in which the residue of formula I is further of formula IV

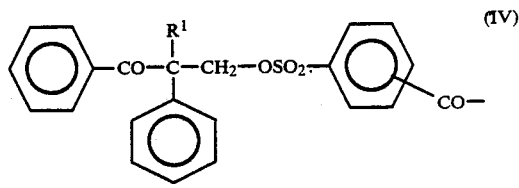

where $R^1$ is OH or $C_1$-$C_4$-alkoxy and the carbonyl group with the free valency is preferably in the para position with respect to the sulphonyloxy group.

When the photosensitive polymer contains a residue of formula I in which X denotes a group of formula III, preferred polymers are those in which
$Ar^1$ denotes a divalent or, if n denotes 1, trivalent aromatic group of 6 to 30 carbon atoms, and
$Ar^2$ denotes a monovalent or divalent aromatic group of 6 to 30 carbon atoms.

More particularly preferred polymers of this class are those in which
$Ar^1$ denotes phenylene, substituted phenylene, naphthylene, substituted naphthylene, benzenetriyl or substituted benzenetriyl, and
$Ar^2$ denotes phenyl, substituted phenyl, phenylene, substituted phenylene, naphthyl, substituted naphthyl, naphthylene or substituted naphthylene.

Further preferred among polymers where X denotes a group of formula III are those in which
$Ar^1$ denotes an o-phenylene, 1,2-, 2,3- or 1,8-naphthylene or benzene 1,2,3-, 1,2,4-, 1,2,5- or 1,2,6-triyl group, optionally substituted by —Cl, —Br, —$NO_2$, $C_1$-$C_8$ alkyl, $C_1$-$C_4$ alkoxy, $C_1$-$C_{12}$ alkylthio or phenylthio, and
$Ar^2$ denotes a phenyl, m- or p-phenylene, naphthyl, or 1,2-, 2,3- or 1,8-naphthylene group, optionally substituted by —Cl, —Br, —$NO_2$, $C_1$-$C_{15}$ alkyl, $C_1$-$C_4$ alkoxy, $C_1$-$C_4$—alkyl—CONH, or phenylCONH—.

Especially preferred polymers where X denotes a group of formula III are those in which
$Ar^1$ denotes an o-phenylene, 1,8-naphthylene or benzene 1,2,4-triyl group and
$Ar^2$ denotes a phenyl, p-tolyl or m- or p-phenylene group.

In the especially preferred polymers where X denotes a group of formula III, preferably one of m and n denotes zero and the other denotes 1. Specific preferred polymers of this kind are those in which the residue of formula I is further of formula V, VI or VII

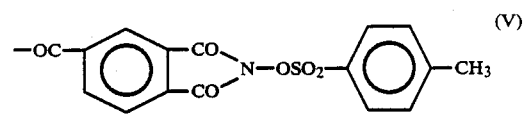

or

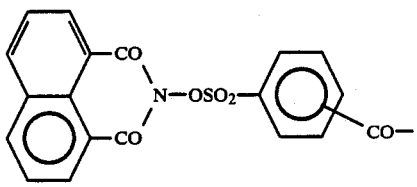

(VI)

or

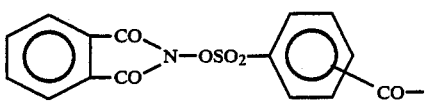

(VII)

where the carbonyl group with the free valency in formula VI or VII is in the meta or para position.

In another class of preferred photosensitive polymers, where one of m and n denotes zero and the other denotes 1, that is where the residue of formula I is monovalent, this residue is attached, either directly or through an intermediate organic group, to the backbone of a polymer. This polymer may be one which has low or negligible solubility in aqueous base but which has several reactive sites such as hydroxyl groups along the backbone which permit the introduction of several photosolubilisable residues through reaction with a compound containing a reactive group such as a carboxyl group and a residue of formula I. An example of such a polymer is a high molecular weight or advanced epoxide resin, derived from a bisphenol or polyhydric alcohol, having several secondary hydroxyl groups along its backbone. Preferably, however, the polymer to which the residue of formula I is attached is soluble in aqueous base.

Suitable aqueous base-soluble polymers include hydroxyl group-containing addition and condensation polymers such as polyvinyl alcohol, polyvinyl phenol and phenolic novolak resins, and carboxyl group- or carboyxlic acid anhydride group-containing addition and condensation polymers such as homopolymers and copolymers of acrylic and methacrylic acids, carboxyl-terminated polybutadienes, homopolymers and copolymers of maleic anhydride and carboxyl-terminated polyesters.

When the base-soluble polymer contains hydroxyl groups, a photosensitive polymer can be prepared by reacting the polymer with a carboxylic acid of formula IX $$(HOOC)_x—Ar^1—X—OSO_2—Ar^2—(COOH)_y \quad (IX)$$

or an esterifying derivative thereof, where one of x and y denotes zero and the other denotes 1, and X, $Ar^1$ and $Ar^2$ are as hereinbefore defined. Suitable esterifying derivatives of the carboxylic acid include the acid halide, lower alkyl ester and glycidyl ester.

When the base-soluble polymer contains carboxyl groups, a photosensitive polymer can be prepared by reacting the polymer with the glycidyl ester of an acid of formula IX, or by converting carboxyl groups in the polymer to acid halide groups and reacting these with a hydroxyalkyl ester of an acid of formula IX.

Other photosensitive polymers containing a monovalent residue of formula I attached to the backbone of a base-soluble polymer can be prepared by copolymerising an acrylate or methacrylate group-containing ester of an acid of formula IX with an ethylenically unsaturated acid. The acrylate or methacrylate group-containing ester can be prepared by reaction of an acid of formula IX, or an esterifying derivative thereof, with a hydroxyalkyl acrylate or methacrylate, by reacting an acid of formula IX with glycidyl acrylate or glycidyl methacrylate, or by reaction of acrylic or methacrylic acid with the glycidyl ester of an acid of formula IX.

Especially preferred photosensitive polymers include those in which the residue of formula I is linked to an oxygen atom attached to the backbone of a base-soluble polymer. More especially preferred polymers are phenolic novolak resins in which at least 4% of the phenolic hydroxyl groups is replaced by a group -OY where Y denotes a residue of formula I in which one of m and n denotes zero and the other denotes 1. Suitable photosensitive phenolic novolak resins are those of formula X

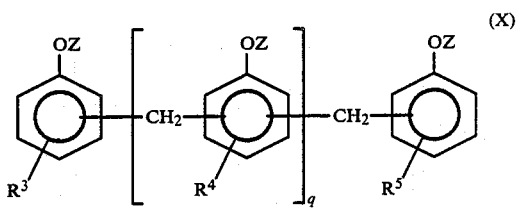

(X)

where

Z denotes a hydrogen atom or Y, at least 4% of Z per average molecule denoting Y, $R^3$, $R^4$, and $R^5$, which may be the same or different, each represent a hydrogen, chlorine or bromine atom, $C_1$-$C_{10}$ alkyl, $C_7$ to $C_{12}$ aralkyl, acetyl, benzoyl, carboxyl, esterified carboxyl or a group-OZ, and q denotes an integer of 1 to 20.

Preferably, at least 7% of the groups Z denotes a group Y, q denotes an integer of 1 to 15, and $R^3$, $R^4$ and $R^5$ each denote a hydrogen atom, an o-, m- or p- methyl group, an o-, m- or p-tert.butyl group or an o-, m- or p-octyl group.

The photosensitive novolak resins may be prepared by reacting a novolak resin, preferably derived from formaldehyde and phenol, a cresol, a tert.butylphenol, an octylphenol or a mixture of two or more thereof, with an acid of formula IX or an esterifying derivative thereof, preferably the acid chloride thereof.

Particularly preferred photosensitive novolak resins are those of formula X where 7-25% of the groups Z denote Y, Y denotes a residue of formula IV, V, VI or VII, some of $R^3$, $R^4$ and $R^5$ denote hydrogen and others denote a p-tert.butyl group.

Other especially preferred photosensitive polymers are those in which the residue of formula I is linked, through a group of formula —$OR^6OCO$—, where $R^6$ denotes an alkylene group of 1 to 8 carbon atoms which may be substituted by a hydroxy group, to a carbon atom in the backbone of the polymer. More especially preferred polymers of this kind are copolymers of (a) a monomer of formula XI $$CH_2=C(R^7)COO—R^6—OY \quad (XI)$$

where $R^7$ denotes —H or —$CH_3$, and

Y denotes a residue of formula I in which one of m and n denotes zero and the other denotes 1, and $R^6$ is as defined above, (b) a polymerisable ethylenically unsaturated acid, and, optionally, (c) another polymerisable ethylenically unsaturated monomer.

The copolymer usually contains, by weight, 20 to 70%, preferably 25 to 60%, of (a); 5 to 30%, preferably 10 to 20%, of (b); and 0 to 70%, preferably 30 to 60%, of (c) where present.

The unsaturated acid (b) may be a sulphonic acid such as vinylsulphonic acid, but is preferably an unsaturated carboxylic acid such as acrylic and methacrylic acids and carboxyl group-containing adducts of a hydroxyalkyl acrylate or methacrylate with a polycarboxylic acid anhydride such as succinic, glutaric, maleic, phthalic and trimellitic anhydrides. Especially preferred unsaturated acids (b) are acrylic and methacrylic acid.

The other ethylenically unsaturated monomer (c), that is a polymerisable monomer other than (a) and (b), may be, when present, an ester of acrylic or methacrylic acid, for example ethyl acrylate or methyl methacrylate, a vinyl halide such as vinyl chloride, a vinyl ester such as vinyl acetate, or a vinyl-substituted aromatic compound such as styrene, alpha-methylstyrene or p-bromostyrene. Preferably it is methyl methacrylate.

Preferred copolymers are those of (a) a monomer of formula XI, (b) acrylic or methacrylic acid, and (c) methyl methacrylate.

In the monomers of formula XI, $R^6$ may denote a methylene, ethylene or 2-hydroxytrimethylene group. Preferably it denotes an ethylene group. In these monomers also, Y preferably denotes a residue of formula IV, V, VI or VII.

The copolymers may be prepared by conventional free radical polymerisation processes, using a peroxide, hydroperoxide or azo compound as initiator. Thus, (a), (b) and, optionally, (c) may be copolymerised by heating in solution or suspension in an organic solvent together with the initiator.

The monomers of formula XI may be prepared by reacting a carboxylic acid of formula IX, or an acid chloride thereof, with a hydroxyalkyl acrylate or methacrylate, by reacting an acid of formula IX with glycidyl acrylate or glycidyl methacrylate, or by reaction of acrylic or methacrylic acid with the glycidyl ester of an acid of formula IX. All of these reactions may be carried out under conventional esterification conditions for the reactive groups concerned.

The carboxylic acids of formula IX, which are intermediates for the photosensitive polymers of the invention, may be represented by the formula XII $$(HOOC)_m—Ar^1—X—OSO_2—Ar^2—(COOH)_n \qquad (XII)$$

where one of m and n denotes 0 or 1 and the other denotes 1, and $Ar^1$, $Ar^2$ and X are as hereinbefore defined. Such acids where X is a group of formula II are believed to be novel, as are those where m and n each denote 1, or m denotes zero and n denotes 1, and X is a group of formula III.

When X denotes a group of formula II, the acids of formula XII may be prepared by reacting an aromatic sulphonyl chloride of formula XIII $$Cl—SO_2—Ar^2—(COOH)_n \qquad (XIII)$$

where n denotes zero or 1, with either a benzoin of formula XIV $$(HOOC)_m—Ar^1—CO—CH(OH)—Ar^3 \qquad (XIV)$$

or a methylolbenzoin or substituted methylolbenzoin of formula XV

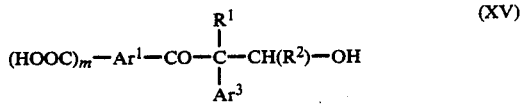

where
m denotes zero or 1,
$Ar^3$ is as defined in formula II, and
$R^1$ and $R^2$ are as defined in formula II when p denotes 1.

This reaction may be carried out under conventional conditions for the reaction of sulphonyl chlorides with hydroxy compounds. Thus, it may be carried out in solution in an organic solvent in the presence of an organic base.

Acrylate and methacrylate group-containing esters of acids of formula XII, where X denotes a group of formula II, instead of being prepared from the acids as hereinbefore described, may be prepared by converting a carboxyl-containing sulphonyl chloride of formula XIII (n=1) into the corresponding carboxylic acid chloride and reacting this with a hydroxyalkyl acrylate or methacrylate before reacting the sulphonyl chloride group with a compound of formula XIV or XV.

When X denotes a group of formula III, the acids of formula XII may be prepared by reacting a N-hydroxyimide of formula XVI

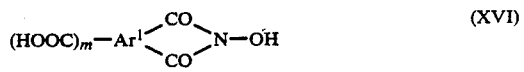

where m denotes zero or 1, with an aromatic sulphonyl chloride of formula XIII. This reaction may be carried out under conventional conditions for the reaction of sulphonyl chlorides with hydroxy compounds. For instance, when the sulphonyl chloride is carboxyl-free, the reaction may be carried out in an organic solvent in the presence of an organic base; when the sulphonyl chloride contains a carboxyl group, the reaction may be carried out in aqueous solution in the presence of an alkali.

If both m and n denote 1, that is if the residue of formula I is divalent, then photosensitive polymers containing units of formula I in the backbone can be prepared. It is possible to link units of formula I to one another either directly or by interposing other comonomers. Such polymers can be prepared having a low or negligible solubility in aqueous base. On exposure to actinic radiation, the backbones of the polymers are split into short pieces which contain sulfonic acid groups and are therefore soluble in aqueous alkaline medium.

Such polymers can, for example, be prepared from difunctional residues of the formula XVII $$M^1—Ar^1—X—OSO_2—Ar^2—M^2 \qquad (XVII)$$

with or without integrating comonomers of the formula XVIII $$N^1—R^8—N^2 \qquad (XVIII)$$

where

X, Ar¹ and Ar² are as defined above,

M¹ and M² denote amino, alkylamino, arylamino, carboxy, esterified carboxy, halogen, aminocarboxy (amide or substituted amide), alkylcarboxy, arylcarboxy, esterified alkylcarboxy or arylcarboxy, mercapto, bromomethyl, chloromethyl, chlorocarbonyl, sulphoxy chloride, alkylsulphoxy chloride, arylsulphoxy chloride, glycidyl, hydroxy, alkylhydroxy, arylhydroxy, isocyanate, carbonyl, alkylcarbonyl, alkenylcarbonyl or arylcarbonyl, N¹ and N² denote amino, carboxy or esterified carboxy, chlorocarbonyl, chlorocarboxy, halogen, hydroxy, mercapto, glycidyl, isocyanato, sulphoxy chloride or carbonyl, and R⁸ denotes alkylene, arylene, aryldialkylene, >C=O, >C=S, >Si(C₆H₅)₂ or >Si(CH₃)₂, and, depending on the polymer desired, M¹ and M² may be identical or different and N¹ and N² may be identical or different.

If, for example, difunctional compounds of formula XVI' are condensed to polymers without integrating comonomers, then for M¹ and M² the following possibilities apply:

if M¹ is NH₂, OH or SH, then M² may be any one of the residues listed, with the exception of amino, alkylamino, arylamino, hydroxy, alkylhydroxy, arylhydroxy and mercapto;

if M¹ is isocyanate (—NCO), then M² may be e.g. amino, alkylamino, arylamino, hydroxy, alkylhydroxy, arylhydroxy, mercapto or —CH₂Br or —CH₂Cl (in the form of a Grignard reagent);

if M¹ is carboxy (—COOH), then M² has the same possible meanings as is the case when M¹ is —NCO, but M² may additionally be glycidyl;

if M¹ is a carboxylic acid derivative of the form —COCl, —COOR, —CONH₂ or CONR₂, or is —SO₂Cl, bromine, chlorine or —CH₂Br or —CH₂Cl, then M² is amino, alkylamino, arylamino, hydroxy, alkylhydroxy, arylhydroxy or mercapto.

If comonomers of formula XVIII are polycondensed with compounds of formula XVII, then M¹ and M² are preferably identical and N¹ and N² are also preferably identical. The possibilities of combination described above for M¹ and M² also apply if comonomers are integrated.

If M¹ and M² in formula XVII are unidentical and N¹ and N² in formula XVIII are unidentical, then examples are preferred in which M¹ and N¹ are identical and M² and N² are identical. In this case, the possibilities of combination described above for M¹ and M² also apply. The person skilled in the art of polycondensation will readily be in a position to select suitable combinations.

Alternatively, polymers of the type described can also be prepared by reacting compounds of the formula XVIII

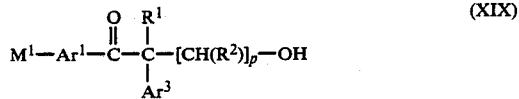

(XIX)

with compounds of formula XVIII where M¹, Ar¹, Ar³, R¹, R², R⁸ and p are as defined above and N¹ and N² denote sulphoxy chloride.

A preferred class of such polymers is prepared by starting from 4-aminobenzoin (prepared from 4-nitrobenzile) and then carrying out the polycondensation with a suitable disulfonyl chloride. Examples of suitable disulfonyl chlorides are condensation products of 3-chlorosulphonylbenzoyl chloride with aliphatic or aromatic diols, or chlorosulphonation products of bisarylene. The resultant condensation products are distinguished by high molecular weights and good film-forming properties and are photostructurable.

A particularly preferred class of such polymers is prepared by reacting 4-aminobenzoin with condensation products of 3-chlorosulphonylbenzoyl chloride with aliphatic or aromatic diols.

Most particularly preferred are polymers formed from 4-aminobenzoin and hexanediol-1,6-bis(3-chlorosulphonylbenzoic acid ester), benzenedimethanol-1,4-bis(3-chlorosulphonylbenzoic acid ester) or chlorosulphonation products of α, ω-diphenoxyalkanes.

Further preferred polymers are derived from 4-hydroxybenzoin (J. Chem. Soc. 1966, 533), which is condensed with disulphonyl chlorides to give polysulfonates. Preferred disulphonyl chlorides are those which are employed for condensation reactions with 4-aminobenzoin.

A further class of preferred polymers is derived from compounds of formula XIX

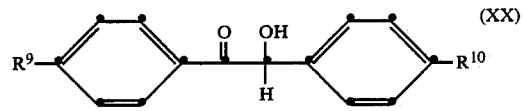

(XX)

where R⁹ and R¹⁰ may denote —COOalkyl, —COCl, —COOH or —N=C=O, with the proviso that either R⁹ or R¹⁰ must be hydrogen, which compounds of formula XIX are reacted with aliphatic or aromatic diols or diamines to give bisbenzoins, which are in turn reacted with disulphonyl chlorides to give polycondensates. Among such polymers, those are particularly preferred which are derived from compounds of formula XIX where R⁹ or R¹⁰ is —COOalkyl.

Particularly preferred polymers are also obtained by condensing 1,4-bis(phenylglyoxyloyl)benzene or 1,3-bis(phenylglyoxyloyl)benzene with disulphonyl chlorides to give polysulfonates. The bisbenzoins are prepared in accordance with German Offenlegungsschrift 3 019 500.

A further preferred class of polymers is prepared by starting from compounds of formula XVI where X is as defined for formula IV, Ar¹ and Ar² are as described above and M¹ and M² are carboxyl groups. Such dicarboxylic acids or dicarboxylates can be reacted with diols or diamines to give polyesters or polyamides respectively.

When the photosensitive polymer of the invention is used to produce an image by the process of this invention, formation of an image can be accelerated by mixing the polymer with a photosensitiser, that is, a compound which acquires an excited state on irradiation and conveys the energy exothermally to the nonexcited photosolubilisable residue of formula I. Such photosensitisers include condensed aromatic hydrocarbons and their substituted derivatives, aromatic carbonyl compounds, aromatic nitro compounds and cationic and basic dyes. Individual classes of suitable photosensitisers are anthracenes, fluoranthenes, pyrenes, anthrones thioxanthones such as 2-methyl- or 2-chlorothioxanthone, and benzophenones, particularly bis(dialkylamino) benzophones such as 4,4'-bis(dimethylamino)benzophenone (Michler's ketone). A dye such as Crystal Violet may be included in the composition to make the image more easily discernible.

In carrying out the process of this invention, a layer of the composition from which the image is to be formed, i.e. the photosensitive polymer together with any optional photosensitiser and other optional additives, may be applied to a support to form a photosensitive element. It may be applied from a solvent, e.g., 2-ethoxyethanol, 2-methoxyethanol, 2-ethoxyethyl acetate, ethyl methyl ketone, N-methylpyrrolidone, dimethylformamide, or mixtures of two or more thereof, in a conventional manner, such as by dipping, spinning, spraying, or by roller. The solvent is then allowed or caused to evaporate, e.g. by air drying or by heating to a temperature below that in which any heat-curable component is cured. The support is generally of copper, aluminium, or other metal, usually in the form of a metal-clad plastics sheet, silicon, oxides or nitrides of silicon, synthetic resin or plastics, such as a film of a polyester, a polyamide, or polyolefin, paper, or glass, and is coated such that the layer, on drying, is about 1–250 micrometers thick.

Exposure of the composition to actinic radiation in a predetermined pattern may be achieved by exposure through an image-bearing transparency consisting of substantially opaque and substantially transparent areas, or by means of a computer-controlled laser beam. Actinic radiation of 200–600 nm is generally used, and suitable sources include carbon arcs, mercury vapour arcs, fluorescent lamps with phosphors emitting ultraviolet light, argon and xenon glow lamps, tungsten lamps, and photographic flood lamps; of these, mercury vapour arcs and metal halide lamps are the most suitable. The exposure time required depends on such factors as the nature of the composition employed, the thickness of the layer, the type of radiation source, and its distance from the layer; it is usually of the order of 30 seconds to 4 minutes, but a suitable duration can readily be found by routine experimentation.

After its imagewise exposure, the layer of the composition is washed with a developer to remove the exposed areas, that is, those struck by radiation, leaving the unexposed areas. The developer dissolves the exposed areas, or renders them much more readily removable by gentle brushing or agitation.

The aqueous base developer may be an aqueous solution of a strong organic base such as triethylamine but an aqueous alkaline solution, e.g., one containing sodium hydroxide, sodium carbonate, or disodium hydrogen phosphate, is preferred. A small proportion, typically 5–15% by volume, of a water-miscible lower aliphatic alcohol e.g. methanol, or acetone may be added to speed development.

After exposure and development, when the support is metallic, it may be etched, either to remove metal from exposed areas in the formation of a printed circuit, or to increase the depth of the image and hence increase its differentiation, the remaining coating in the unexposed areas protecting the underlying substrate from attack. Suitable etching procedures, e.g., using ferric chloride or ammonium persulphate solutions on copper substrates, are well known. The whole area of the support can then, if desired, be exposed to further radiation for a more prolonged period in a non-imagewise manner, the remaining coating becoming soluble in basic solutions to expose the support below.

In another post-development procedure when the support is metallic, it is plated with a metal such as copper, tin, lead or nickel, the polymeric coating in the unexposed areas is removed, for example by non-imagewise exposure to radiation, and the metal thereby bared is etched as hereinbefore described.

The process of this invention is useful in the production of printing plates and of printed, integrated or hybrid circuits.

The following Examples illustrate the invention. Unless otherwise specified, parts are by weight. All of the polymers prepared and used in the Examples are solid polymers having molecular weights of at least 500.

EXAMPLE 1

Trimellitic anhydride (100 g) is added to hydroxylamine hydrochloride (36.7 g) dissolved in pyridine (250 ml). The mixture is stirred and heated to 90° C., when it turns red. After 1 hour at 90° C., the pyridine is evaporated under vacuum. The residue is dispersed in water (350 ml) and, while cooling, concentrated hydrochloric acid (150 ml) is added slowly. After stirring for 1 hour, the solid which precipitates is filtered off, washed with water and recrystallised by dissolving in a mixture of acetone (250 ml) and water (250 ml), adding water and evaporating the acetone under vacuum. The crystalline product is filtered off, washed with water and dried at 110° C. under vacuum to give 77 g of N-hydroxytrimellitimide, having a melting point of 236°–238° C.; IR(KBr disc) 1740·cm$^{-1}$; NMR (dimethyl sulphoxide d$_6$) 7.85–8.4 (m-5H).

The N-hydroxytrimellitimide (30 g) and p-toluenesulphonyl chloride (27.6 g) are dissolved in acetonitrile (130 ml). To the solution pyridine (22.9 g) is added over 15 minutes. After leaving the resulting mixture for 1 hour, concentrated hydrochloric acid (20 g) is added, followed by water (500 ml). The solid which precipitates is filtered off, washed with water, dissolved in acetone and reprecipitated by adding water. The resulting solid is filtered off, washed with water and dried to give 44 g of N-(p-toluenesulphonyloxy)trimellitimide, m.pt. 210°–212° C.; IR(KBr disc) 1740, 1590, 1390, 1180, 960, 700 cm$^{-1}$; NMR (dimethyl sulphoxide d$_6$) 2.45 (s-3H), 7.4–8.5 (m-7H); Analysis: Found C 53.90, H 3.68, N 3.81%; Theory C 53.18, H 3.06, N 3.87%.

EXAMPLE 2

N-(p-toluenesulphonyloxy)trimellitimide (15.2 g), prepared as described in Example 1, is suspended in thionyl chloride (50 ml) and dimethylformamide (0.5 ml) is added. The mixture is heated to 50° C. until no further gas evolution is observed. The resulting clear solution is cooled and petroleum ether (150 ml) is added slowly. The crystalline solid which forms is filtered off, washed with petroleum ether and dried at 100° C. under vacuum to give 15 g of N-(p-toluenesulphonyloxy)-4-chlorocarbonylphthalimide (N-(p-toluenesulphonyloxy)trimellitic acid chloride imide, the acid chloride of the product of Example 1). The product is characterised as the ethyl ester, m.pt. 131°–133° C.; IR (KBr disc) 1730, 1700, 1590, 1380, 1180, 1080, 810, 710, 700, 690 cm$^{-1}$; NMR (deuterated chloroform) 7.7–8.5 (m-3H), 7.2–8.0 (m-4H), 4.2–4.4 (m-2H), 2.4 (s-3H), 1.2–1.5 (t-3H).

The acid chloride (5 g) is dissolved in methylene chloride and hydroxyethyl methacrylate (1.8 g) is added. To this mixture pyridine (1.05 g) is added slowly. After 2 hours at room temperature, the mixture is washed in turn with water, 2% hydrochloric acid solution and 2% sodium carbonate solution. The product is crystallised from a mixture of methylene chloride and methanol to give 4.5 g of N-(p-toluenesulphonyloxy)-4-methacryloyloxyethoxycarbonylphthalimide (N-(p-toluenesulphonyloxy)methacryloxyethyltrimellitimide), m.pt. 113° C.; IR(KBr disc) 1740, 1710, 1700, 1390, 1310, 1290, 1270, 1250, 1190, 1170, 1140, 1080, 960, 810, 720, 710, 700 cm$^{-1}$; NMR (deuterated chloroform) 1.85 (s-3H), 2.45 (s-3H), 4.5 (m-4H), 5.5 (m-1H), 6.1 (m-1H), 7.3–8.0 (m-4H), 7.8–8.5 (m-3H); Analysis: Found C 54.82, H 4.30, N 2.76%; Theory C 55.81, H 4.01, N 2.96%.

EXAMPLE 3

To a solution of N-hydroxy-1,8-naphthalimide (5 g) in water (600 ml) sodium carbonate (2.5 g) is added to give a red solution. The solution is filtered and to the filtrate is added sodium bicarbonate (2 g) and 4-chlorosulphonylbenzoic acid (5.25 g). The solution becomes colourless and a solid precipitates. After 2 hours, the mixture is acidified and the precipitated solid is filtered off, washed with water and dried over phosphorus pentoxide under vacuum to give 7.7 g of N-(4-carboxyphenylsulphonyloxy)-1,8-naphthalimide, which is recrystallised from cyclohexane, m.pt. above 300° C. (decomposition); IR (KBr disc) 1720, 1700, 1680, 1580, 1370, 1190, 1000, 880, 770, 730, 700 cm$^{-1}$; NMR (dimethyl sulphoxide d$_6$) 7.4–8.6 (m-10H).

EXAMPLE 4

3-Chlorosulphonylbenzoyl chloride (4.0 g) (prepared from 3-chlorosulphonylbenzoic acid and thionyl chloride) is mixed with a solution of distilled hydroxyethyl methacrylate (2.17 g) in methylene chloride (8 g). To this mixture is added slowly at room temperature pyridine (1.32 g) in methylene chloride (2 g). After 1 hour, N-hydroxyphthalimide (2.73 g) is added, followed by pyridine (1.5 g). After a further hour, the mixture is washed in turn with water, 2% hydrochloric acid solution and 2% sodium carbonate solution. The mixture is then dried over magnesium sulphate and the solvent is evaporated to give 7.4 g of a colourless oil, N-(3-methacryloyloxyethoxycarbonylphenylsulphonyloxy)-phthalimide; IR (KBr disc) 1800, 1750, 1720, 1400, 1300, 1270, 1200, 960, 880, 700 cm$^{-1}$; NMR (deuterated chloroform) 7.3–8.7 (m-4H), 7.9 (s-4H), 6.2 (m-1H), 5.6 (m-1H), 4.6 (m-4H), 1.9 (s-3H).

EXAMPLE 5

3-Chlorosulphonylbenzoylchloride (1 g), prepared from 3-chlorosulphonylbenzoic acid and thionyl chloride, is mixed with a solution of distilled hydroxyethyl methacrylate (0.54 g) in methylene chloride (4 g). Pyridine (0.33 g) in methylene chloride (1 g) is added to the mixture slowly at room temperature. After 1 hour, alpha-methylolbenzoin (1.01 g) is added, followed by pyridine (0.35 g). After stirring for 3 days, the mixture is washed in turn with water, 2% hydrochloric acid solution and 2% sodium carbonate solution. The mixture is then dried over magnesium sulphate, stabilised with 0.1% of 2,6-di tert.butyl-4-methylphenol and evaporated to give 21 g of a colourless oil, alpha-(3-methacryloyloxyethoxycarbonylphenylsulphonyloxy)methyl benzoin; IR (KBr disc) 3450, 3060, 2950, 1720, 1680, 1600, 1460, 1370, 1300, 1270, 1190, 1140, 1080, 1000, 990, 950, 880, 820, 750, 740, 700 cm$^{-1}$; NMR (deuterated chloroform) 7.7–8.8 (m-14H), 6.2 (s-1H), 5.6 (m-1H), 4.6 (m-4H), 2.0 (s-3H).

EXAMPLE 6

Sodium carbonate (16 g) is added to a solution of N-hydroxy-1,8-naphthalimide (16 g) in water (600 ml). The red solution obtained is filtered and to the filtrate is added 3-chlorosulphonylbenzoic acid (18.2 g), prepared by chlorosulphonation of benzoic acid. After stirring for 2 hours, the solid which precipitates is filtered off and redispersed in water. The dispersion is acidified with hydrochloric acid and the solid is filtered off, washed with water and dried under vacuum to give 27 g of N-(3-carboxyphenylsulphonyloxy)-1,8-naphthalimide.

EXAMPLE 7

The carboxylic acid product of Example 6 (20 g) is suspended in methylene chloride (50 ml). Thionyl chloride (10 ml) and dimethylformamide (1 ml) are added and the mixture is heated under reflux for 4 hours, by which time gas evolution has ceased. The mixture is cooled and the solid formed is filtered off to give 15.4 g of the acid chloride, N-(3-chlorocarbonylphenylsulphonyloxy)-1,8-naphthalimide, m.pt. 185° C.

To a suspension of the acid chloride (14.75 g) in methylene chloride (50 ml) hydroxyethyl methacrylate (5.2 g) is added. Pyridine (3.1 g) is added slowly to the mixture. After 2 hours at room temperature, the reaction mixture is diluted with methylene chloride (200 ml) and washed in turn with water, 2% hydrochloric acid solution and 2% sodium carbonate solution. The methylene chloride solution is then dried over magnesium sulphate. Methanol is added to the dried solution and the methylene chloride is partly evaporated. The solid which crystallises is filtered off and washed with methanol to give 16.1 g of N-(3-methacryloyloxyethoxycarbonylphenylsulphonyloxy)-1,8-naphthalimide, m.pt. 172° C.; IR (KBr disc) 1720, 1700, 1590, 1400, 1200, 890, 780, 710 cm$^{-1}$; NMR (deuterated chloroform) 7.3–8.8 (m-4H), 6.2 (m-1H), 5.6 (m-1H), 4.6 (m-4H), 1.9 (d-3H).

EXAMPLE 8

The product of Example 3 (4 g) is suspended in thionyl chloride (10 ml) and dimethylformamide (0.1 ml) is added. The mixture is heated at 50° C. for 2 hours, when gas evolution has ceased. The thionyl chloride is partially evaporated to deposit a crystalline solid. This is filtered off and washed with methylene chloride to give 3.3 g of N-(4-chlorocarbonylphenylsulphonyloxy)-1,8-naphthalimide, the acid chloride of the acid of Example 3, characterised as the methyl ester, m.pt. 220° C.; Analysis: Found C 54.41, H 2.10, N 3.42%; Theory C 54.88, H 2.42, N 3.36%; IR (KBr disc) 3100, 1730, 1690, 1580, 1400, 1330, 1230, 1200, 1180, 1010, 900, 890, 780, 740, 700, 650; NMR (dimethyl sulphoxide d$_6$) 7.7–8.4 (m-10H), 4.0 (s-3H).

The acid chloride (1 g) is added at room temperature to a solution in pyridine (6 g) of a novolak resin (3 g), prepared by reaction of phenol, p-tert.butylphenol and formaldehyde in the molar ratio 0.75:0.25:0.90 using oxalic acid as catalyst and having a softening point of 120° C. (The novolak is of formula X where q has an average value of 7.5). After 1 hour, the resulting solution is diluted with acetone and added to water (600 ml) containing concentrated hydrochloric acid (8 g). The solid which precipitates is filtered off, dried and dissolved in acetone. The solution is filtered to remove traces of insoluble material and then evaporated to give 3.5 g of modified novolak resin.

EXAMPLE 9

The product of Example 7 (2.25 g), methacrylic acid (1.05 g) and methyl methacrylate (2.25 g) are dispersed in 2-methoxyethanol (42.5 g). Azobis(isobutyronitrile) (0.0055 g) is added and the mixture is cooled to 10° C. and purged three times with nitrogen. The mixture is then heated, with stirring, at 65° C. for 22 hours to effect polymerisation. The resulting copolymer solution is filtered to remove traces of insoluble material.

EXAMPLE 10

The procedure of Example 9 is repeated using, in place of the reaction mixture used in that Example, a mixture of the product of Example 4 (4.0 g), methacrylic acid (0.8 g), methyl methacrylate (3.2 g), 2-ethoxyethanol (32 g) and azobis(isobutyronitrile) (0.0048 g), to give a copolymer solution.

EXAMPLE 11

The procedure of Example 9 is repeated using, in place of the reaction mixture used in that Example, a mixture of the product of Example 5 (3.75 g), methacrylic acid (0.75 g), methyl methacrylate (3.0 g), 2-methoxyethanol (42.5 g) and azobis(isobutyronitrile) (0.0045 g), to give a copolymer solution. The solution is added to diethyl ether (200 ml) to precipitate the solid copolymer, which is filtered off to give 2.3 g of the copolymer.

EXAMPLE 12

4-Nitrobenzile (10 g; 0.039 mole) (prepared in accordance with J. Chem. Soc. 1938, 1402) is dissolved in dioxane (200 ml). After the addition of Raney nickel (3 g), the mixture is hydrogenated for 51 hours at a normal pressure and at 30° C. under $N_2$ ($H_2$ uptake 3.72 liters, 101% of theory). The yellow solution is filtered and the filtrate is concentrated. The residue is recrystallised from absolute alcohol to give 6.5 g of 4-aminobenzoin in the form of yellowish, fluffy needles, m.pt. 199°–203° C.

EXAMPLE 13

$\alpha,\alpha,\alpha$-Trichlorotoluene (586.4 g; 3 moles) is added dropwise at 120° C. to chlorosulphonic acid (524.2 g; 4.5 moles). The mixture is stirred for 4 hours at 120° C. and then overnight at 20° C. After distillation of the excess chlorosulphonic acid, the product is distilled off. Fractional distillation affords 503 g of 3-chlorosulphonylbenzoyl chloride as a virtually colourless liquid, b.pt. (15 torr) 153°–155° C.

EXAMPLE 14

Under $N_2$, 3-chlorosulphonylbenzoyl chloride (24.15 g; 0.101 ml) is added at 0° C. to methylene chloride (50 ml). A solution of 1,6-hexanediol (5.91 g; 0.05 mole) and triethylamine (10.32 g; 0.102 mole) in methylene chloride (50 ml) is added dropwise at 0°–5° C. to the mixture. After stirring for 6 hours at 20° C., the reaction mixture is filtered and the filtrate is washed with 2×50 ml of $H_2O$, 2×50 ml of 1N $NaHCO_3$ and with 1×50 ml of saturated NaCl solution. The organic phase is dried over $MgSO_4$ and filtered and the filtrate is concentrated. The wax-like residue is boiled out with cyclohexane (800 ml) and toluene (100 ml). After filtration over kieselguhr, the clear solution is frozen at −20° C. and, with stirring, allowed to defrost overnight. The precipitate is filtered off. After drying, 10.8 g of 1,6-bis(3′-chlorosulphonylbenzoyloxy)hexane are obtained in the form of white crystals (m.pt. 74°–76° C.).

EXAMPLE 15

Under $N_2$, 3-chlorosulphonylbenzoyl chloride (24.15 g; 0.101 mole) is added at 0° C. to methylene chloride (50 ml). A solution of benzene-1,4-dimethanol (6.91 g; 0.05 mole) and triethylamine (10.32 g; 0.102 mole) in tetrahydrofuran (50 ml) is added dropwise at 0°–5° C. to the mixture. After stirring for 6 hours at 20° C., the reaction mixture is filtered and the filtrate is diluted with methylene chloride (100 ml) and washed with 2×50 ml of $H_2O$, 2×50 ml of 1N $NaHCO_3$ and 1×50 ml of saturated NaCl solution. The organic phase is dried over $MgSO_4$ and filtered and the filtrate is concentrated. The residue is recrystallised twice from a mixture of chloroform and hexane to give 5.01 g of benzenedimethanol-1,4-bis(3-chlorosulphonylbenzoic acid ester) in the form of fine white crystals, m.pt. 150°–151° C.

EXAMPLE 16

Under $N_2$, 4-aminobenzoin (1.51 g; 6.66 mmol) and the product of Example 14 (3.49 g; 6.66 mmol) are suspended at 0° C. in tetrahydrofuran (33 ml). 30% NaOH (2.25 ml; 17.3 mmol) is added dropwise at 0° C. and the mixture is stirred for 6 hours at 0° C. The resultant pale yellow suspension is poured into cold 1N HCl (200 ml), and saturated NaCl solution (50 ml) is added. After the organic phase has been separated, the aqueous phase is extracted with three 100 ml portions of methylene chloride. The combined organic phases are washed until neutral, dried over $MgSO_4$ and filtered and the filtrate is concentrated. After drying at 0.01 torr, a solid yellow residue (2.87 g; 59%) remains.

As determined by gas permeation chromatography (GPC) in dimethylformamide with polystyrene as standard, the average molecular weight ($M_w$) is about 83,000. According to GPC, the residue still contains 10 to 20% of

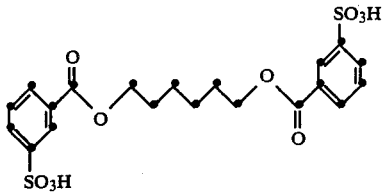

and traces of 4-aminobenzoin.

EXAMPLE 17

Under $N_2$, 4-aminobenzoin (2.02 g; 8.89 mmol) and the product of Example 15 (4.83 g; 8.89 mmol) are suspended at 0° C. in tetrahydrofuran (44 ml). 30% NaOH (3.08 ml; 23.11 mmol) is added dropwise and the mixture is stirred for 6 hours at 0° C. The resultant pale yellow solution is poured into cold 1N HCl (250 ml), and saturated NaCl solution (75 ml) is added. After the organic phase has been separated, the aqueous phase is extracted with three 100 ml portions of methylene chloride. The combined organic phases are washed until neutral, dried over $MgSO_4$ and filtered and the filtrate is concentrated. After drying at 0.01 torr, a solid yellow residue (5.5 g; 80%) remains.

As determined by GPC with polystyrene as standard, the average molecular weight ($M_w$) is in the range from 60,000 to 100,000.

EXAMPLE 18

To a 30% solution of the modified novolak product of Example 8 (1.7 g) in 2-ethoxyethanol is added 5 drops of a 2% solution of Crystal Violet in a solvent mixture comprising 2-ethoxyethanol, 2-ethoxyethyl acetate and ethyl methyl ketone in the volume ratio 2:2:1. The mixture is coated onto a cleaned copper-clad laminate and dried at 90° C. for 5 minutes to give a coating 8 micrometres thick. The coating is irradiated through a negative using a 5000 w metal halide lamp at a distance of 75 cm. for 1 minute. Development with aqueous 1% sodium hydroxide removes the exposed areas to give a good image in 90 seconds.

EXAMPLE 19

To the copolymer solution obtained in Example 10 (1.2 g) are added 1-methoxycarbonylthioxanthone and 5 drops of the Crystal Violet solution described in Example 18. The mixture is coated onto a cleaned copper-clad laminate and dried at 90° C. for 5 minutes to give a coating 7 micrometers thick. The coating is irradiated through a negative using a 5000 w metal halide lamp at a distance of 75 cm. for 1 minute. Development with aqueous 0.5% sodium hydroxide solution containing 10% by volume of acetone removes the coating in exposed areas to give a good image in 1 minute.

EXAMPLE 20

To the copolymer solution obtained in Example 9 (1.2 g) is added the Crystal Violet solution described in Example 18 (5 drops). The mixture is coated onto a cleaned copper-clad laminate and dried at 90° C. for 5 minutes to give a coating 8 micrometers thick. The coating is irradiated through a negative using a 5000 w metal halide lamp at a distance of 75 cm for 2 minutes. Development with aqueous 2% sodium hydroxide solution containing 10% by volume of acetone removes the coating in exposed areas to give a good image in 2 minutes.

EXAMPLE 21

To the copolymer solution obtained in Example 11 (1.2 g) is added the Crystal Violet solution described in Example 18 (5 drops). The mixture is coated onto a cleaned copper-clad laminate and dried at 90° C. for 5 minutes to give a coating 5 micrometers thick. The coating is irradiated through a negative using a 5000 w metal halide lamp at a distance of 75 cm for 1 minute. Development with aqueous 1% sodium hydroxide solution removes the coating in exposed areas to give a good image in 2 minutes.

EXAMPLE 22

A solution of the polymer obtained in Example 16 is coated by means of a doctor knife (40 μm wet film thickness) onto an anodised and electrolytically roughened aluminium sheet (offset plate substrate) and dried for 25 minutes at 80° C. (layer thickness: about 10 μm). The coating is exposed imagewise through a mask to the radiation of a 5000 W metal halide lamp (Sylvania M 061; distance to the vacuum frame: 65 cm). The exposed areas are dissolved out in an alkaline bath (C1290, Hotsell Graphic Industries, Morley/GB, diluted with water (1:1)) and a positive image is formed.

What is claimed is:

1. An acrylic polymer having an average molecular weight of at least 500 which is insoluble in base but which becomes soluble in base on exposure to actinic radiation and which contains at least one residue of formula I $$(-L^1-)_m Ar^1(X)-OSO_2-Ar^2(-L^2-)_n \qquad (I)$$

wherein
one of m and n denotes 1 and the other denotes 0 or 1,
X denotes either a group of formula II

linked through the carbonyl group to an aromatic carbon atom in $Ar^1$, or a group of formula III

linked through the carbonyl groups to aromatic carbon atoms in $Ar^1$,
p denotes 0 or 1,
when p denotes 0, $R^1$ is a hydrogen atom; $C_1$-$C_8$alkyl which is unsubstituted or substituted by —OH, —Cl, —CN, $C_1$-$C_4$alkoxy, $C_2$-$C_5$alkoxycarbonyl, phenyl, chlorophenyl, $C_7$-$C_{10}$alkylphenyl or $C_7$-$C_{10}$alkoxyphenyl; phenyl which is unsubstituted or substituted by —Cl, $C_1$-$C_4$alkyl, $C_1$-$C_4$alkoxy or $C_1$-$C_4$alkylthio; benzoyl; $C_2$-$C_8$alkoxycarbonyl; $C_1$-$C_4$alkyl—NHCO—; phenyl—NHCO; —CONH$_2$; or —CN;
when p denotes 1, $R^1$ is a hydrogen atom, a hydroxyl group, $C_1$-$C_4$alkoxy, acetyloxy or a $C_1$-$C_8$alkyl group which is unsubstituted or substituted by phenol;
$R^2$ denotes a hydrogen atom; $C_1$-$C_8$alkyl which is unsubstituted or substituted by —OH, Cl or phenyl; phenyl which is unsubstituted or substituted by —OH, —Cl, $C_1$-$C_4$alkyl or $C_1$-$C_4$alkoxy; $C_2$-$C_6$alkenyl; $C_8$-$C_9$phenylalkenyl; furyl; $C_5$-$C_6$cycloalkyl; or $C_5$-$C_6$cycloalkenyl;
when X denotes a group of formula II, $Ar^1$ and $Ar^2$ each represent a phenyl, naphthyl, phenylene or naphthylene group which is unsubstituted or substituted by —Cl, —Br, —CN, —NO$_2$, $C_1$-$C_{12}$alkyl, $C_1$-$C_4$alkoxy or $C_1$-$C_8$alkylthio, at least one of $Ar^1$ and $Ar^2$ being an unsubstituted or substituted phenylene or naphthylene group;
when X denotes a group of formula III, $Ar^1$ denotes an o-phenylene, 1,2-, 2,3- or 1,8-naphthylene benzene 1,2,3-, 1,2,5-, 1,2,4- or 1,2,6-triyl group, unsubstituted or substituted by —Cl, —Br, —NO$_2$, $C_1$-$C_8$alkyl, $C_1$-$C_4$alkoxy, $C_1$-$C_{12}$alkylthio or phenylthio; and $Ar^2$ denotes phenyl, m- or p-phenylene, naphthyl, or 1,2-, 2,3- or 1,8-naphthylene group, which is unsubstituted or substituted by —Cl, —Br, —NO$_2$, $C_1$-$C_{15}$alkyl, $C_1$-$C_4$alkoxy, $C_1$-$C_4$alkyl—CONH, or phenyl-CONH—;
$Ar^3$ denotes a phenyl group which is unsubstituted or substituted by —Cl, $C_1$-$C_4$alkyl, $C_1$-$C_4$alkoxy or $C_1$-$C_4$alkylthio; and $L^1$ $L^2$ each denote —CO—, —COO—, —CONH—, —OCOO—. —NHCONH—, —OCONH—, —CSS—, —OCSS—, —OSO$_2$—, —CH$_2$—, —CH=, —O—, —S— or —N=.

2. A polymer according to claim 1 in which in formula I
X denotes a group of formula II,
p denotes 1,
$R^1$ denotes a hydroxyl group, a $C_1$-$C_4$-alkyl group or a $C_1$-$C_4$-alkoxy group, and
$R^2$ denotes a hydrogen atom or a $C_1$-$C_4$-alkyl group.

3. A polymer according to claim 1 in which in formula I
X denotes a group of formula III,
$Ar^1$ denotes an o-phenylene, 1,2-, 2,3- or 1,8-naphthylene or benzene 1,2,3-, 1,2,4-, 1,2,5- or 1,2,6-triyl group, or said group substituted by —Cl, —Br, —NO$_2$, $C_1$-$C_8$ alkyl, $C_1$-$C_4$ alkoxy, $C_1$-$C_{12}$ alkylthio or phenylthio, and
$Ar^2$ denotes a phenyl, m- or p-phenylene, naphthyl, or 1,2-, 2,3- or 1,8-naphthylene group, or said group substituted by —Cl, —Br, —NO$_2$, $C_1$-$C_{15}$ alkyl, $C_1$-$C_4$ alkoxy, $C_1$-$C_4$—alkyl—CONH—, or phenyl-CONH—.

4. A polymer according to claim 1 which is a copolymer of at least two ethylenically unsaturated monomers, at least one of said monomers being
(a) a monomer of formula XI $$CH_2=C(R^7)COO-R^6-OY \quad\quad XI$$

where
$R^6$ denotes an alkylene group of 1 to 8 carbon atoms which is unsubstituted or substituted by a hydroxyl group,
$R^7$ denotes —H or —CH$_3$, and
Y denotes a residue of formula I in which one of m and n denotes zero and the other denotes 1,
and at least one of said monomers being
(b) a polymerizable ethylenically unsaturated acid.

5. A copolymer according to claim 4 which is a copolymer of (a) and (b) with
(c) an ester of acrylic or methacrylic acid.

6. A polymer according to claim 2, in which
$R^1$ denotes —OH or $C_1$-$C_4$ alkoxy,
$R^2$ denotes a hydrogen atom,
$Ar^1$ and $Ar^2$ each represent a phenyl or phenylene group, at least one of $Ar^1$ and $Ar^2$ being a phenylene group, and
$Ar^3$ denotes a phenyl group.

7. A polymer according to claim 6, in which the residue of formula I is of formula IV

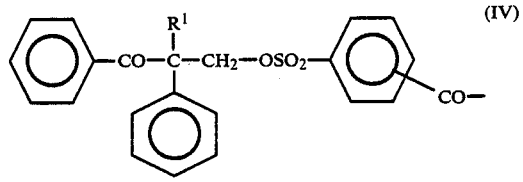

(IV)

where $R^1$ denotes a hydroxyl group or $C_1$-$C_4$ alkoxy and the carbonyl group with the free valency is preferably in the para position to the sulphonyloxy group.

8. A polymer according to claim 1, in which one of m and n denotes zero and the other denotes 1, and the residue of formula I is attached, directly or through an organic group, to the backbone of a polymer.

9. An acrylic polymer according to claim 1 which is a copolymer of at least two ethylenically unsaturated materials, (a) at least one of said unsaturated materials being an acrylate or methacrylate group-containing ester of an acid of the formula $$(HOOC)_x-Ar^1-X-OSO_2-Ar^2-(COOH)_y$$

wherein one of x and y is 0 and the other is 1, and x, $Ar^1$ and $Ar^2$ are as defined in claim 26, and (b) at least one other of said unsaturated materials being an ethylenically unsaturated acid.

10. An acrylic polymer according to claim 4 wherein the unsaturated acid (b) is acrylic or methacrylic acid.

11. An acrylic polymer according to claim 5, wherein the unsaturated acid (b) is acrylic or methacrylic acid.

12. An acrylic polymer according to claim 5 wherein the ester is methyl methacrylate.

13. An acrylic polymer according to claim 4 wherein $R^6$ is an ethylene group.

14. An acrylic polymer according to claim 4 wherein Y is a residue of the formula IV, V, VI or VII

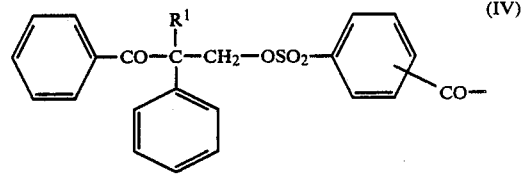

(IV)

or

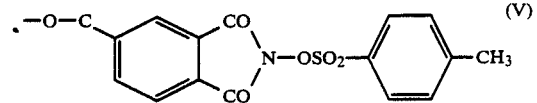

(V)

or

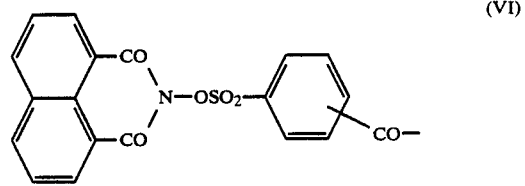

(VI)

or

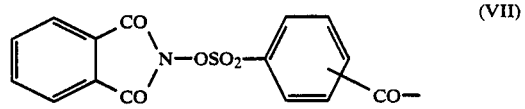

(VII)

15. An acrylic polymer according to claim 14 wherein $R_6$ is an ethylene group.

* * * * *